United States Patent
Ko

(10) Patent No.: US 7,374,999 B2
(45) Date of Patent: May 20, 2008

(54) SEMICONDUCTOR DEVICE

(75) Inventor: Kwang Young Ko, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 133 days.

(21) Appl. No.: 11/318,441

(22) Filed: Dec. 28, 2005

(65) Prior Publication Data

US 2006/0138584 A1    Jun. 29, 2006

(30) Foreign Application Priority Data

Dec. 29, 2004   (KR)   ................. 10-2004-0115645

(51) Int. Cl.
*H01L 21/336* (2006.01)

(52) U.S. Cl. ............... 438/294; 438/197; 438/257; 438/264; 438/266; 438/267; 438/297; 257/E21.546

(58) Field of Classification Search ............. 438/294
See application file for complete search history.

(56) References Cited

U.S. PATENT DOCUMENTS

| 5,930,644 | A | * | 7/1999 | Tsai et al. ............. 438/424 |
| 2005/0029616 | A1 | * | 2/2005 | Noda et al. ............. 257/500 |

* cited by examiner

*Primary Examiner*—Michael Lebentritt
*Assistant Examiner*—Kyoung Lee
(74) *Attorney, Agent, or Firm*—McKenna Long & Aldridge LLP

(57) ABSTRACT

A semiconductor device includes a substrate including a high-voltage transistor area provided with a high-voltage transistor and a low-voltage transistor area provided with a low-voltage transistor; a LOCOS layer provided as a device isolation layer of the high-voltage transistor area; and a shallow-trench isolation layer provided as a device isolation layer of the low-voltage transistor area. Accordingly, a sufficient breakdown voltage level can be provided in a high-voltage transistor area, on-resistance and leakage current can be enhanced, and the chip area in a low-voltage transistor area can be reduced.

4 Claims, 3 Drawing Sheets

SEMICONDUCTOR DEVICE

This application claims the benefit of Korean Patent Application No. 10-2004-0115645, filed on Dec. 29, 2004, which is hereby incorporated by reference for all purposes as if fully set forth herein.

BACKGROUND OF THE INVENTION

1. Field of the Invention

The present invention relates to a semiconductor device, and more particularly, to a semiconductor device having respective areas for high-voltage and low-voltage transistors.

2. Discussion of the Related Art

Referring to FIG. 1, illustrating a semiconductor device according to a related art, a high-voltage transistor of about 30V or higher is arranged in a high-voltage transistor area and a low-voltage transistor is arranged in a low-voltage transistor area. A local oxidation of silicon (LOCOS) layer 111 is used as a device isolation layer for each of the high- and low-voltage transistors.

The high-voltage transistor includes $n^+$ type source/drain regions 141 provided in predetermined upper parts of a $p^-$ type substrate 100 to be spaced apart from each other. In particular, the drain region 141 is arranged within an $n^-$ type extended drain area 103 working as a drift area. The substrate 100 between the $n^+$ type source region 141 and the $n^-$ type extended drain area 103 corresponds to a channel area 101. A gate insulating layer pattern 121 and a gate conductive layer pattern 122 are sequentially stacked on the channel area 101. The $n^+$ type source/drain regions 141 are electrically connected to source (S) and drain (D) electrodes, respectively.

The low-voltage transistor includes $n^+$ type source/drain regions 151 provided in predetermined upper parts of the $p^-$ type substrate 100 to be spaced apart from each other. The substrate 100 between the $n^+$ type source/drain regions 151 corresponds to a channel area 102. A gate insulating layer pattern 131 and a gate conductive layer pattern 132 are sequentially stacked on the channel area 102. The $n^+$ source/drain regions 151 are electrically connected to source and drain electrodes, respectively.

In the above-configured semiconductor device according to the related art, the LOCOS layer 111 is used as a device isolation layer of the high-voltage transistor area to secure a high breakdown voltage for the high-voltage transistor. Since the LOCOS layer 111 is provided to the low-voltage transistor area, however, the chip area of the low-voltage transistor area is increased.

Referring to FIG. 2, illustrating another semiconductor device according to a related art, a high-voltage transistor of about 30V or higher is arranged in a high-voltage transistor area and a low-voltage transistor is arranged in a low-voltage transistor area. A shallow-trench isolation layer 211 is used as a device isolation layer for each of the high- and low-voltage transistors, to enable a smaller chip area. Yet, in the high-voltage transistor area, it is difficult for the shallow-trench isolation layer 211 to enable a required level of breakdown voltage. The on-resistance and leakage current characteristic are degraded due to a linear profile of the shallow-trench isolation layer 211.

SUMMARY OF THE INVENTION

Accordingly, the present invention is directed to a semiconductor device that substantially obviates one or more problems due to limitations and disadvantages of the related art.

An advantage of the present invention is to provide a semiconductor device, by which a sufficient breakdown voltage level can be enabled in a high-voltage transistor area, by which on-resistance and leakage current can be enhanced, and by which the chip area in a low-voltage transistor area can be reduced.

Additional features and advantages of the invention will be set forth in the description which follows and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the invention, as embodied and broadly described, there is provided a semiconductor device comprising a substrate including a high-voltage transistor area provided with a high-voltage transistor and a low-voltage transistor area provided with a low-voltage transistor; a LOCOS layer as a device isolation layer of the high-voltage transistor area; and a shallow-trench isolation layer as a device isolation layer of the low-voltage transistor area.

In another aspect of the present invention, a method of fabricating a semiconductor device includes providing a LOCOS layer in a high-voltage transistor area; and providing a shallow-trench isolation layer in a low-voltage transistor area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 1:
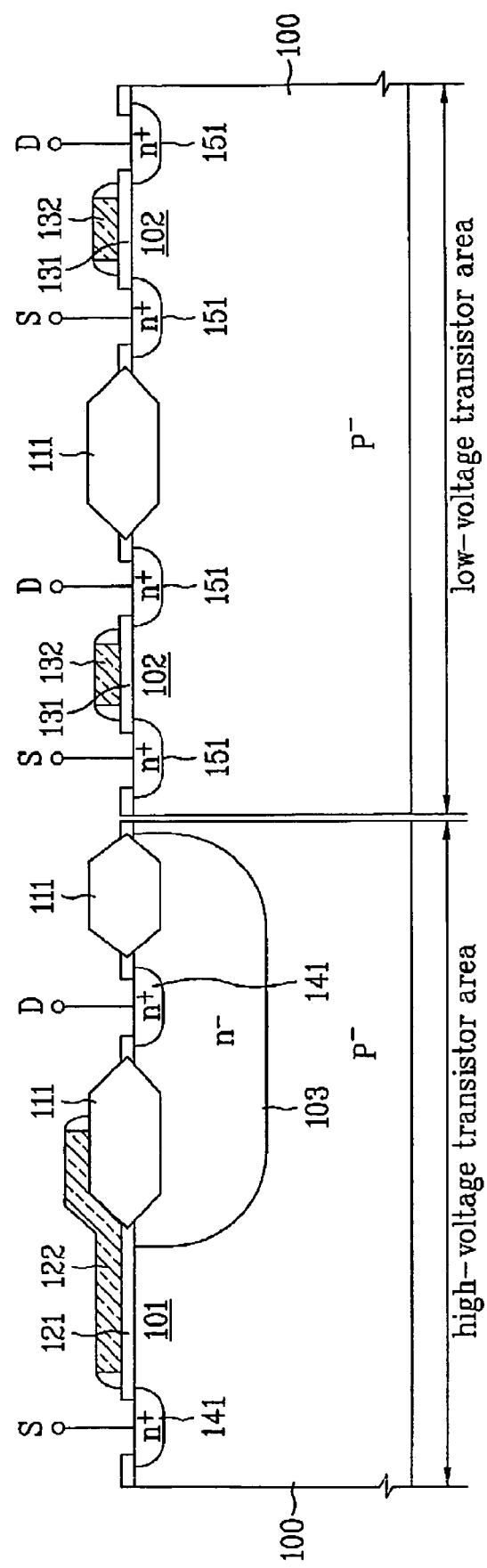
FIGS. 1 and 2 are cross-sectional views of semiconductor devices of the related art.
Figure 2:
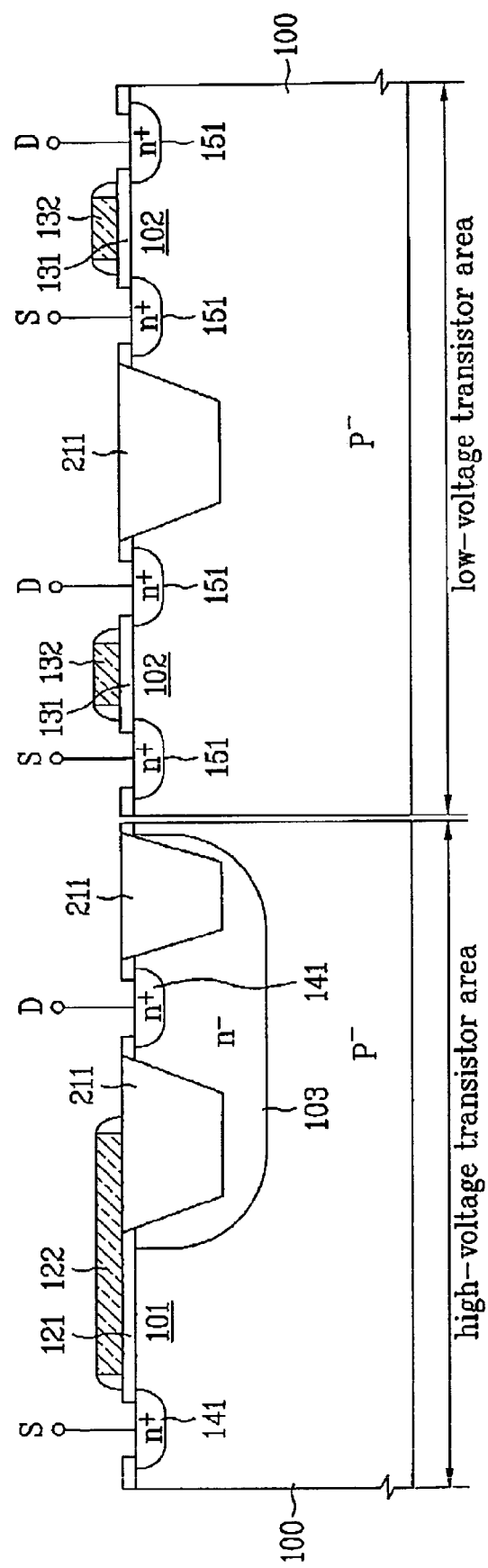
Figure 3:
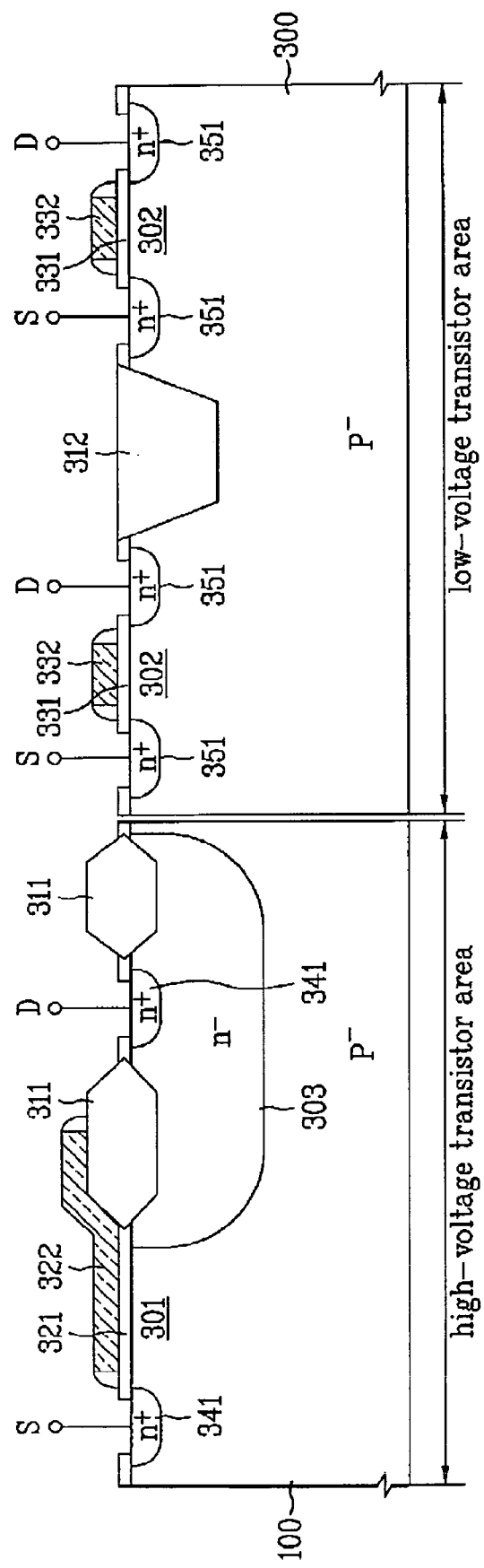
FIG. 3 is a cross-sectional view of a semiconductor device according to the present invention.

Referring to FIG. 3, illustrating a semiconductor device according to the present invention, a high-voltage transistor of about 30V or higher is arranged in a high-voltage transistor area and a low-voltage transistor is arranged in a low-voltage transistor area. The low-voltage transistor may be a complementary metal-oxide-semiconductor transistor as used in a logic circuit. A LOCOS layer 311 is used as a device isolation layer in the high-voltage transistor area, whereas a shallow-trench isolation layer 312 is used as a device isolation layer in the low-voltage transistor area. Hence, a breakdown voltage of at least 30V can be obtained in the high-voltage transistor area. Also, the chip area in the low-voltage transistor area can be reduced.

The high-voltage transistor includes $n^+$ type source/drain regions 341 provided in predetermined upper parts of a $p^-$ type substrate 300 to be spaced apart from each other. In particular, the drain region 341 is arranged within an $n^-$ type extended drain area 303 working as a drift area. A surface of the substrate 300 between the $n^+$ type source region 341 and the $n^-$ type extended drain area 303 corresponds to a channel area 301. A gate insulating layer pattern 321 and a gate conductive layer pattern 322 are sequentially stacked on the channel area 301. The $n^+$ type source/drain regions 341 are electrically connected to source and drain electrodes, respectively.

The low-voltage transistor includes $n^+$ type source/drain regions 351 provided in predetermined upper parts of the $p^-$ type substrate 300 to be spaced apart from each other. A surface of the substrate 300 between the $n^+$ type source/drain regions 351 corresponds to a channel area 302. A gate insulating layer pattern 331 and a gate conductive layer pattern 332 are sequentially stacked on the channel area 302. The $n^+$ type source/drain regions 351 are electrically connected to source and drain electrodes, respectively.

In a method of fabricating a semiconductor device according to the present invention, a LOCOS layer is provided in a high-voltage transistor area and a shallow-trench isolation layer is provided in a low-voltage transistor area.

In forming the LOCOS layer in the high-voltage transistor area, a well is first formed in a high-voltage transistor area by ion implantation and annealing. After completion of the well, the extended drain region 303 is formed. The LOCOS layer 311 is then formed within the high-voltage transistor area by the following techniques. A pad oxide layer is deposited over a substrate 300. Then, a pad nitride layer or a hard mask layer is deposited on the pad oxide layer. A photoresist is deposited on the nitride layer and selectively etched and developed to expose a surface of the substrate 300 for the LOCOS layer 311. The resulting photoresist pattern is used to mask the low-voltage transistor area. Then, a trench is etched into the high-voltage transistor area. A thermal oxidation process is conducted to form the LOCOS layer 311 on the exposed surface of the substrate 300. Then, the photoresist is removed.

Subsequently, the shallow-trench isolation layer 312 is formed in the low-voltage transistor area using the following techniques. Another photoresist is deposited on the substrate 300 and selectively etched and developed. The resulting photoresist pattern is used to mask the high-voltage transistor area. An STI trench is then formed in the low-voltage transistor area by a two-step etching process. The first step of the etching process is used to etch the pad nitride layer and the pad oxide layer. Then, the photoresist is removed. The second step of the etching process is used to etch the substrate 300 using the etched pad nitride and oxide layers as a mask, thereby forming the STI trench. Then, a thermal treatment is performed to form an oxide liner in the STI trench. Then, the STI trench is filled by depositing an insulating material over the STI trench. The insulating material may be deposited by a HPCVD process or a CVD process. Then, the insulating material is planarized by a chemical mechanical polishing process. Then, a hydrogen fluoride treatment is performed to strip the pad nitride layer in the low-voltage transistor area. Thus, the shallow-trench isolation layer 312 is formed.

After completion of the LOCOS layer 311 in the high-voltage transistor area and the trench isolation layer 211 in the low-voltage transistor area, ion implantation and annealing are performed on the low-voltage transistor area to form a well area. Gate insulating layer patterns 321 and 331 and gate conductive layer patterns 322 and 332 are sequentially stacked on the high- and low-voltage transistor areas to form gate stacks, respectively. Subsequently, source and drain regions 341 and 351 are formed by ion implantation and annealing.

Accordingly, by using the LOCOS layer as the device isolation layer of the high-voltage transistor area and by using the shallow-trench isolation layer as the device isolation layer of the low-voltage transistor area, a high breakdown voltage can be obtained in the high-voltage transistor area. Also, the chip area in the low-voltage transistor area can be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, comprising:

providing a substrate including a high-voltage transistor area provided with a high-voltage transistor having a breakdown voltage of not less than 30V and a low-voltage transistor area provided with a low-voltage transistor;

providing a LOCOS layer in a high-voltage transistor area; and providing a shallow-trench isolation layer in a low-voltage transistor area.

2. The method of claim 1, wherein providing a LOCOS layer comprises:

forming a well in a high-voltage transistor area by ion implantation and annealing; and forming an extended drain region.

3. The method of claim 2, wherein providing a LOCOS layer further comprises:

depositing a pad oxide layer over a substrate;

depositing a pad nitride layer on the pad oxide layer;

depositing a photoresist on the pad nitride layer;

selectively etching and developing the photoresist to expose a surface of the substrate and to form a photoresist pattern;

etching a trench into the high-voltage transistor area using the photoresist pattern as a mask for the low-voltage transistor area;

thermally oxidizing the substrate to form the LOCOS layer on the exposed surface of the substrate; and removing the photoresist pattern.

4. The method of claim 1, wherein providing a shallow-trench isolation layer comprises:

depositing a photoresist on a substrate;

selectively etching and developing the photoresist to expose a surface of the substrate and to form a photoresist pattern;

etching a pad nitride layer and a pad oxide layer in the low-voltage transistor area using the photoresist pattern as a mask for the high-voltage transistor area;

removing the photoresist pattern;

etching the substrate using the etched pad nitride layer and the etched pad oxide layers as a mask, thereby forming an STI trench;

forming an oxide liner in the STI trench by a thermal treatment process;

depositing an insulating material over the substrate including the STI trench, thereby filling the STI trench with the insulating material;

planarizing the insulating material; and performing a treatment to strip the pad nitride layer in the low-voltage transistor area.

* * * * *